(12) United States Patent
Dhamrin et al.

(10) Patent No.: US 10,446,291 B2
(45) Date of Patent: Oct. 15, 2019

(54) PASTE COMPOSITION

(71) Applicant: TOYO ALUMINIUM KABUSHIKI KAISHA, Osaka-shi, Osaka (JP)

(72) Inventors: Marwin Dhamrin, Osaka (JP); Shota Suzuki, Osaka (JP); Ken Kikuchi, Osaka (JP); Masahiro Nakahara, Osaka (JP); Naoya Morishita, Osaka (JP)

(73) Assignee: TOYO ALUMINIUM KABUSHIKI KAISHA, Osaka-shi (JP)

( * ) Notice: Subject to any disclaimer, the term of this patent is extended or adjusted under 35 U.S.C. 154(b) by 0 days.

(21) Appl. No.: 15/747,527

(22) PCT Filed: Sep. 27, 2016

(86) PCT No.: PCT/JP2016/078422
§ 371 (c)(1),
(2) Date: Jan. 25, 2018

(87) PCT Pub. No.: WO2017/057349
PCT Pub. Date: Apr. 6, 2017

(65) Prior Publication Data
US 2018/0218801 A1 Aug. 2, 2018

(30) Foreign Application Priority Data

Sep. 29, 2015 (JP) .................................. 2015-191275

(51) Int. Cl.
*H01B 1/22* (2006.01)
*H01L 21/225* (2006.01)
(Continued)

(52) U.S. Cl.
CPC ............. *H01B 1/22* (2013.01); *H01L 21/225* (2013.01); *H01L 21/228* (2013.01);
(Continued)

(58) Field of Classification Search
CPC ................................ H01L 31/022; H01B 1/22
(Continued)

(56) References Cited

U.S. PATENT DOCUMENTS

| 2011/0017291 A1 | 1/2011 | Morita et al. | |
| 2012/0325307 A1* | 12/2012 | Li | H01B 1/22 136/256 |
| 2013/0160835 A1* | 6/2013 | Inaba | H01B 1/22 136/256 |

FOREIGN PATENT DOCUMENTS

| JP | 3-119722 A | 5/1991 |
| JP | 2002-75894 A | 3/2002 |

(Continued)

OTHER PUBLICATIONS

International Search Report dated Nov. 8, 2016, issued in counterpart International Application No. PCT/JP2016/078422 (2 pages).

*Primary Examiner* — Khanh T Nguyen
(74) *Attorney, Agent, or Firm* — Westerman, Hattori, Daniels & Adrian, LLP

(57) ABSTRACT

Provided is a paste composition that enables the formation of a diffusion layer with a high concentration of n-type dopant element on a semiconductor substrate in a simple manner. The paste composition is intended to form a film on a semiconductor substrate. The paste composition contains an aluminum powder, a compound containing an n-type dopant element, a resin, and a solvent. The n-type dopant element is one, two, or more elements selected from the group consisting of phosphorus, antimony, arsenic, and bismuth. The content of the n-type dopant element in the n-type dopant element-containing compound is 1.5 parts by mass or more and 1000 parts by mass or less, per 100 parts by mass of aluminum contained in the aluminum powder.

1 Claim, 2 Drawing Sheets

(51) Int. Cl.
   *H01L 31/18*      (2006.01)
   *H01L 21/22*      (2006.01)
   *H01L 21/228*     (2006.01)
   *H01L 31/0216*    (2014.01)
   *H01L 31/0224*    (2006.01)
   *H01L 31/028*     (2006.01)
   *H01L 51/00*      (2006.01)

(52) U.S. Cl.
   CPC ...... *H01L 21/2225* (2013.01); *H01L 21/2254* (2013.01); *H01L 31/028* (2013.01); *H01L 31/02167* (2013.01); *H01L 31/022425* (2013.01); *H01L 31/18* (2013.01); *H01L 31/1804* (2013.01); *H01L 51/0007* (2013.01)

(58) Field of Classification Search
   USPC .......................................... 136/256; 252/512
   See application file for complete search history.

(56) References Cited

FOREIGN PATENT DOCUMENTS

| | | |
|---|---|---|
| JP | 2007-53353 A | 3/2007 |
| TW | 201337958 A | 9/2013 |
| WO | 2009/125787 A1 | 10/2009 |
| WO | 2014/024297 A1 | 2/2014 |
| WO | 2014/039413 A1 | 3/2014 |

\* cited by examiner

PASTE COMPOSITION

TECHNICAL FIELD

The present invention relates to a paste composition for forming a film on a semiconductor substrate.

BACKGROUND ART

There have been proposed methods using phosphorus as an n-type dopant to form an n layer on an intrinsic semiconductor substrate or a p-type semiconductor substrate, and to form an n+ layer on an n-type semiconductor substrate. Specifically, the following methods are known: a method comprising performing treatment in a mixed gas atmosphere of phosphorus oxychloride, nitrogen, and oxygen, for example, at 800 to 900° C. for several tens of minutes (e.g., Patent Literature 1); and a method comprising forming an n-type diffusion layer with a solution containing a phosphoric salt, such as phosphorus pentoxide (e.g., Patent Literature 2).

CITATION LIST

Patent Literature

Patent Literature 1: WO2014/024297
Patent Literature 2: JP2002-75894A

SUMMARY OF INVENTION

Technical Problem

However, the methods disclosed in the patent literature above are less productive and require excess energy because of the need for a prolonged period of heating treatment to form an n layer, and even the need for batch processing. In addition to these problems in production, it has been difficult to form, in particular, an n layer with a high concentration of phosphorus (i.e., n+ layer) by the techniques disclosed in the patent literature, and there has remained an issue in efficient formation of an n+ layer.

The present invention was completed in view of the current state of the art, and an object of the invention is to provide a paste composition that enables the formation of a diffusion layer with a high concentration of n-type dopant element on a semiconductor substrate in a simple manner.

Solution to Problem

The present inventors conducted extensive research to achieve the object, and found that a paste composition containing a specific dopant element in a specific amount can achieve the object, thus completing the present invention.

Specifically, the present invention includes, for example, the subject matter described in the following item.
Item 1.
   A paste composition for forming a film on a semiconductor substrate, the composition comprising
      an aluminum powder,
      a compound containing an n-type dopant element,
      a resin, and
      a solvent
   wherein the n-type dopant element is one, two, or more elements selected from the group consisting of phosphorus, antimony, arsenic, and bismuth, and
   the content of the n-type dopant element in the n-type dopant element-containing compound is 1.5 parts by mass or more and 1000 parts by mass or less, per 100 parts by mass of aluminum contained in the aluminum powder.

Advantageous Effects of Invention

The use of the paste composition according to the present invention enables the formation of a diffusion layer with a high concentration of n-type dopant element on a semiconductor substrate through simple steps in a short period of time.

DESCRIPTION OF EMBODIMENTS

Figure 1:
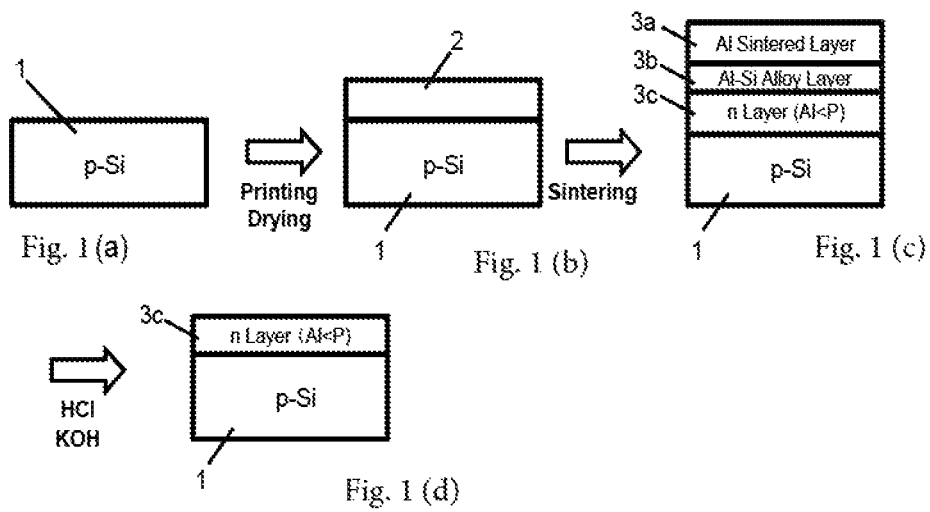
FIGS. 1(a)-1(d) are explanatory diagrams illustrating an example of the process for forming a diffusion layer on a semiconductor substrate using the paste composition.

The following describes an embodiment of the present invention in detail.

The paste composition according to this embodiment is a material applied to a semiconductor substrate to form a film.

The paste composition contains an aluminum powder, a compound containing an n-type dopant element, a resin, and a solvent. The n-type dopant element is one, two, or more elements selected from the group consisting of phosphorus, antimony, arsenic, and bismuth. In addition, the content of the n-type dopant element in the n-type dopant element-containing compound is 1.5 parts by mass or more and 1000 parts by mass or less, per 100 parts by mass of aluminum contained in the aluminum powder.

The paste composition of this configuration enables the formation of a diffusion layer with a high concentration of n-type dopant element on a semiconductor substrate through simple steps in a short period of time. The diffusion layer as used here refers to the layer that is formed so as to contain an element constituting the semiconductor substrate and an n-type dopant element, and may also be called an "impurity layer." The diffusion layer can contain aluminum to the degree that the layer does not become a p layer or p+ layer. This diffusion layer can be formed into either an n-type layer (n layer) or p-type layer (p layer), depending on the type and amount of impurities contained in the layer. For example, when the atomic concentration of the dopant element described above (e.g., phosphorus), which is an n-type dopant, is higher than that of aluminum, which is a p-type dopant, the diffusion layer becomes an n layer.

The paste composition in this embodiment is likely to form an n layer, which has a higher concentration of an n-type dopant element than that of aluminum. An n layer with a particularly high concentration of an n-type dopant element is called an "n+ layer."

The following describes in detail the paste composition according to this embodiment and formation of a diffusion layer using this composition.

The aluminum powder is a primary component of the paste composition. When the paste composition is used, for example, as a starting material for producing crystalline silicon solar cells, the aluminum powder can be a starting material for forming electrodes. Applying the paste composition containing the aluminum powder to a silicon semiconductor substrate and calcining the substrate to form a film gives an Al—Si alloy layer and a diffusion layer on the surface of the silicon semiconductor substrate. The aluminum powder thus can be a starting material to form the alloy layer and diffusion layer.

The aluminum powder primarily contains elemental aluminum. The purity of aluminum in the aluminum powder is not limited, and is, for example, preferably 99.7% or more, and more preferably 99.9% or more. The aluminum powder may contain impurities other than aluminum, for example, other inevitable metal elements. The aluminum powder may also contain alloys of aluminum and other metal elements, aluminum oxides, etc.

The shape of the aluminum powder may be, for example, spherical or elliptical, but is not limited to these shapes. From the standpoint of excellent printability and excellent reactivity with a semiconductor substrate, the shape of the aluminum powder is preferably spherical.

The mean particle size of the aluminum powder ($D_{50}$) is also not particularly limited. However, the mean particle size is preferably 1 μm or more and 20 μm or less because the mean particle size in this range increases the printability of the paste composition and the reactivity of the composition with a semiconductor substrate. A more preferable mean particle size of the aluminum powder is 2 to 4 μm.

The compound containing an n-type dopant element is a starting material for forming a diffusion layer, such as n layers and n+ layers, on a semiconductor substrate. The compound containing an n-type dopant element may be hereinafter simply referred to as "n-type dopant compound."

The n-type dopant element is one, two, or more elements selected from the group consisting of phosphorus (P), antimony (Sb), arsenic (As), and bismuth (Bi). This n-type dopant element makes it possible to form an n-type semiconductor layer on a semiconductor substrate, and is particularly effective when the semiconductor substrate is silicon, which is in group four.

The n-type dopant compound may be either an inorganic compound or an organic compound. The compound containing an n-type dopant element may be formed of two or more compounds, and may contain both an inorganic compound and an organic compound.

Examples of the n-type dopant compound include oxides and organic compounds of the elements listed above, but the n-type dopant compound is not limited to these. Examples of more specific n-type dopant compounds include $P_2O_5$, aluminum phosphate, calcium phosphate, potassium phosphate, and phosphoric esters. The type of phosphoric esters is not particularly limited, and examples include known phosphoric esters; in particular, the n-type dopant compound preferably contains polyoxyethylene oleyl ether phosphoric acid. The n-type dopant compound may contain glass containing an oxide of the n-type dopant element (i.e., "fritted glass").

The content of the n-type dopant element in the n-type dopant compound is 1.5 parts by mass or more and 1000 parts by mass or less, per 100 parts by mass of aluminum contained in the aluminum powder. The content of the n-type dopant element that falls within this numerical range enables efficient formation of a diffusion layer on a semiconductor substrate; in particular, a higher concentration of the n-type dopant element in the diffusion layer makes it easier to form an n+ layer on a semiconductor substrate. Since 1000 parts by mass is set as the upper limit of the content of the n-type dopant element in the n-type dopant compound, the proportion of aluminum in the paste composition is unlikely to be small, preventing the degradation of the reactivity with the semiconductor substrate.

The lower limit of the content of the n-type dopant element in the n-type dopant compound, per 100 parts by mass of aluminum contained in the aluminum powder, is preferably 2 parts by mass, while the upper limit is preferably 10 parts by mass, and particularly preferably 5 parts by mass.

Due to the n-type dopant compound contained in the composition, the paste composition can form a diffusion layer such as an n+ layer on a semiconductor substrate. The use of such a semiconductor substrate on which an n+ layer is formed as a substrate of, for example, solar cell modules can enhance the efficiency of electric generation of the solar cells. The content of the n-type dopant element falling within the numerical range also makes it possible to form a diffusion layer on a semiconductor substrate in a short period of time.

Examples of solvents include diethylene glycol monobutyl ether, terpineol, diethylene glycol monobutyl ether acetate, and dipropylene glycol monomethyl ether. The solvent for use is, however, not limited to these examples, and known organic solvents etc. are also usable.

The resin is a material that functions as a binder in the paste composition. Examples of the resin include cellulose, such as ethyl cellulose and nitro cellulose, polyvinyl butyral, phenol resin, melamine resin, urea resin, xylene resin, alkyd resin, unsaturated polyester resin, acrylic resin, polyimide resin, furan resin, urethane resin, polyethylene, polypropylene, polystyrene, ABS resin, polymethylmethacrylate, polyvinyl chloride, polyvinylidene chloride, polyvinyl acetate, polyvinyl alcohol, polyacetal, polycarbonate, polyethylene terephthalate, polybutylene terephthalate, polyphenylene oxide, polysulfone, polyimide, polyethersulfone, polyarylate, polyether ether ketone, polytetrafluoroethylene, silicon resin, and thermosetting resin (e.g., isocyanate compounds and cyanate compounds), but the resin for use is not limited to these examples. The paste composition may contain one, two, or more resins.

The content of the resin can be 0.2 mass % or more and 3.0 mass % or less based on the paste composition, and the content of the solvent can be 1.0 mass % or and 25.0 mass % or less based on the paste composition.

The paste composition in this embodiment may further contain a glass powder in addition to the n-type dopant compound. This glass powder assists the reaction between the aluminum powder and the semiconductor substrate and also assists the sinter of the aluminum powder. Examples of the glass powder include glass powders containing one, two, or more elements, other than the n-type dopant element. The glass particles constituting the glass powder preferably have a mean particle size of 1 μm or more and 3 μm or less. The content of the glass powder in the paste composition is, although not particularly limited to, preferably 0.1 parts by mass or more and 15 parts by mass or less, per 100 parts by mass of the aluminum powder. A film formed by applying the paste composition containing such a glass powder to a semiconductor substrate and subjecting it to sintering adheres well to the semiconductor substrate, and also its electrical resistance is unlikely to increase.

The paste composition may contain a variety of other additives as long as the effect of the present invention is not impaired. Examples of the variety of additives include antioxidants, corrosion inhibitors, defoamers, thickening agents, coupling agents, electrostatic imparting agents, polymerization inhibitors, thixotropic agents, and antisettling agents.

The paste composition in this embodiment can be prepared by any available method, and the method is not particularly limited. The composition in this embodiment can be prepared, for example, by obtaining predetermined amounts of the aluminum powder, the compound containing an n-type dopant element, the resin, the solvent, the optionally added glass powder described above, and other additives and mixing them.

The resin and the solvent can be mixed beforehand to prepare an "organic vehicle," and the paste composition in this embodiment may be prepared using this organic vehicle. The organic vehicle may include the glass powder and the additives, but the organic vehicle does not necessarily have to contain the solvent, and the resin may be used as it is as an organic vehicle without being dissolved in the solvent. The content of the organic vehicle in the paste composition may be, although not particularly limited to, 30 parts by mass or more and 100 parts by mass or less, per 100 parts by mass of the aluminum powder. The organic vehicle in an amount within this numerical range makes it easier to prevent the decrease in printability of the paste composition.

The paste composition in this embodiment can be prepared using a known mixer, disperser, etc.

The use of the paste composition in this embodiment enables formation of a film on a semiconductor substrate. The film can be formed, for example, by applying the paste composition to the surface of a semiconductor substrate, and subjecting it to sintering. The film formed in this manner is a laminate composed of, for example, a diffusion layer containing an n-type dopant element (e.g., an n+ layer), an alloy layer containing aluminum, and a sintered aluminum layer.

The following describes in detail a method for forming a film on a semiconductor substrate using the paste composition, in particular, a method for forming a diffusion layer on a semiconductor substrate using the paste composition.

Examples of the semiconductor substrate include crystalline silicon (Si) substrates, such as monocrystalline silicon substrates and polycrystalline silicon substrates, and germanium substrates. The semiconductor substrate can be formed of silicon with a purity of 99% or more or germanium with a purity of 99% or more. Alternatively, the semiconductor substrate may be formed of silicon and germanium in any proportions. The semiconductor substrate may also contain elements other than silicon and germanium as impurities or additives.

The semiconductor substrate as described above can be obtained, for example, by slicing an ingot and forming the slice into a desired shape. The thickness of the semiconductor substrate is not particularly limited, and a semiconductor substrate with a thickness suitable for the intended use can be desirably formed. The thickness of the semiconductor substrate may be, for example, 150 μm or more and 550 μm or less, and in particular, when the substrate is used in solar cells, the thickness of the substrate is preferably 150 μm or more and 250 μm or less.

The semiconductor substrate may be formed of a p-type semiconductor, an n-type semiconductor, or an intrinsic semiconductor. For example, the use of a p-type silicon substrate as a semiconductor substrate makes it more noticeable whether the diffusion layer formed on the silicon substrate is an n+ layer when forming an n+ layer using the paste composition.

To form a film on a semiconductor substrate using the paste composition, the following steps 1 to 3, for example, are performed.

step 1: applying the paste composition to the surface of a semiconductor substrate to form a film.

step 2: sintering the semiconductor substrate on which the film is formed and performing cooling treatment.

step 3: performing etching.

FIGS. 1(a)-(d) are diagrams illustrating the method for forming a film on a semiconductor substrate through steps 1 to 3. In FIG. 1, a p-type silicon substrate (which hereinafter may be referred to as "p-Si") is used as semiconductor substrate 1 (FIG. 10 1(a)), and elemental phosphorus (P) is used as an n-type dopant element.

The method for applying the paste composition to the surface of a semiconductor substrate in step 1 is not particularly limited, and methods such as, but not limited to, screen printing and spin coating can be used, or other methods may be used. The amount of the paste composition applied to the semiconductor substrate may be, for example, 4 mg/cm$^2$ or more and 12 mg/cm$^2$ or less.

After applying the paste composition in step 1, performing drying treatment removes the volatile portion in the paste composition. The temperature for drying treatment is, for example, 100° C. or more and 300° C. or less. The time period for drying treatment varies depending on the type of paste composition, but, for example, drying for 1 minute or more and 10 minutes or less is sufficient.

Performing step 1 described above can form film 2, which is the paste composition dried, on the semiconductor substrate p-Si as shown in FIG. 1(b).

Performing the heating treatment (sintering treatment) in step 2 forms sintered aluminum layer 3a and alloy layer 3b, which contains aluminum, as shown in FIG. 1(c). In the embodiment of FIG. 1, alloy layer 3b, which contains aluminum, is an alloy layer of aluminum and silicon.

The cooling treatment after the heating treatment (sintering treatment) allows portions of aluminum and n-type dopant element (P) to diffuse across the silicon substrate, forming an impurity layer, or "diffusion layer 3c." Diffusion layer 3c thus formed contains n-type dopant element (P) in a higher concentration than the concentration of aluminum. This results in the formation of diffusion layer 3c as an n+ layer, providing an n-type silicon substrate as shown in FIG. 1(c).

The temperature for sintering in step 2 is, for example, 577° C. or more and 1200° C. or less. The sintering temperature within this range enables efficient formation of sintered aluminum layer 3a, aluminum-containing alloy layer 3b, and diffusion layer 3c in a short period of time. The sintering temperature is particularly preferably 850° C. or more and 950° C. or less.

The sintering time may be, for example, 3 seconds or more and 300 seconds or less. The sintering time within this range enables formation of a desired film, and even makes the entire process not too long, thus enabling efficient formation of a diffusion layer on a semiconductor substrate.

The sintering in step 2 may be performed in either an air atmosphere or a nitrogen atmosphere.

In the cooling treatment in step 2, the cooling rate and the temperature of the atmosphere during cooling are not limited, and cooling can be performed under suitable conditions. Natural cooling can be performed at room temperature, for example, in an atmosphere at 25° C.

As shown in FIG. 1(c), step 2 forms, in sequence from semiconductor substrate 1, diffusion layer 3c, aluminum-containing alloy layer 3b (an alloy layer of aluminum and silicon), and sintered aluminum layer 3a as a lamination on semiconductor substrate 1 (p-Si).

Step 3 removes aluminum present on the surface by etching. Specifically, by etching, step 2 removes sintered aluminum layer 3a and aluminum-containing alloy layer 3b formed on semiconductor substrate 1 (p-Si). This results in formation of semiconductor substrate 1 on the surface of which diffusion layer 3c is provided, as shown in FIG. 1(d).

The conditions for etching in step 3 are not particularly limited, and, for example, known etching conditions can also be applied in this step. Etching can be performed using an etchant containing, for example, KCl and HCl.

In the method for forming a diffusion layer through steps 1 to 3 described above, the use of the paste composition containing a specific amount of one, two, or more n-type dopant elements selected from the group consisting of phosphorus, antimony, arsenic, and bismuth enables the formation of a diffusion layer on a semiconductor substrate in a simple manner. Although the formation of a diffusion layer, in particular, has typically suffered from poor productivity and required excess energy due to the need of heating treatment for a prolonged time period, even requiring batch processing, the use of the paste composition enables the formation of a diffusion layer in a short period of time in a simple manner.

Forming a diffusion layer by heating treatment typically maintains the solid-phase silicon in the solid phase even when heating is performed at about 800° C. The thermal diffusion rate at which the n-type dopant element diffuses into the solid-phase silicon is about 1 µm/hour, depending on the type of element and the temperature though. However, the use of the paste composition causes, for example, a reaction between solid-phase silicon and aluminum once at about 600° C. to form a liquid-phase silicon-aluminum alloy, which allows the n-type dopant element to immediately diffuse into the liquid-phase silicon-aluminum alloy (e.g., diffusing to a depth of 5 µm by heating at 800° C. for about 10 seconds). Cooling at the following stage recrystallizes and solidifies the silicon, but portions of the n-type dopant element remain inside the silicon, thereby forming a diffusion layer. More specifically, the use of the paste composition involves a different formation process of the diffusion layer from that of traditional methods, and enables the n-type dopant element to diffuse in a short time because silicon turns into its liquid phase once.

Due to the specific content of the n-type dopant element, the paste composition enables the formation of particularly a layer with a high concentration of the n-type dopant element (e.g., phosphorus), "n+ layer," as a diffusion layer by a simple method. Application of semiconductor substrates containing the thus-formed diffusion layer in crystalline silicon solar cells can therefore enhance the efficiency of electric generation of the crystalline silicon solar cells. Semiconductors containing the thus-formed diffusion layer can also have applications in a variety of fields, including semiconductor diodes and semiconductor transistors that require the formation of p-n junctions.

FIGS. 2(a)-(e) illustrate another example of the method for forming a diffusion layer using the paste composition according to this embodiment. In this embodiment as well, diffusion layer 3c is formed on semiconductor substrate 1 by performing steps 1 to 3 described above.

Figure 2:
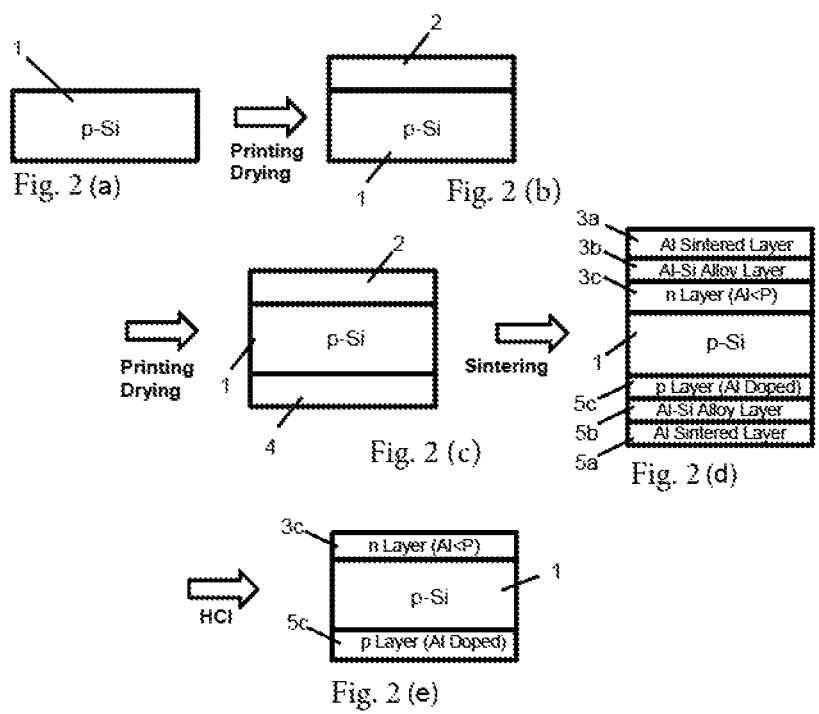
FIGS. 2(a)-2(e) are explanatory diagrams illustrating another example of the process for forming a diffusion layer on a semiconductor substrate using the paste composition.

First, the paste composition is applied to one surface of semiconductor substrate 1 and the coating is dried to form film 2 by the same method as in step 1 (FIG. 2(b)), and an aluminum paste is applied to the other surface of semiconductor substrate 1, which is opposite the surface on which film 2 is formed, and the coating is dried to form aluminum film 4 as shown in FIG. 2(c). Aluminum film 4 can be formed under the same conditions, for example, as in step 1, but the forming conditions are not limited to the conditions in step 1.

The aluminum paste for use here is a paste different from the paste composition. This aluminum paste typically does not contain the n-type dopant compound described above, or the content of the n-type dopant element in the aluminum paste is lower than in the paste composition. More specifically, the content of the dopant element in the n-type dopant element-containing compound in the aluminum paste is less than 1.5 parts by mass per 100 parts by mass of aluminum contained in the aluminum powder. Other components contained in the aluminum paste may be the same as those of the paste composition.

As described above, forming film 2 on one surface of semiconductor substrate 1 and aluminum film 4 on the other surface and performing step 2 provides diffusion layer 3c, aluminum-containing alloy layer 3b, and sintered aluminum layer 3a, which are laminated on one surface of semiconductor substrate 1 in this order from semiconductor substrate 1 as shown in FIG. 1, while providing on the other surface of semiconductor substrate 1, diffusion layer 5c, aluminum-containing alloy layer 5b, and sintered aluminum layer 5a in this order from semiconductor substrate 1 (FIG. 2(d)). Diffusion layer 5c is formed because aluminum diffuses across semiconductor substrate 1. Diffusion layer 5c differs from diffusion layer 3c in that diffusion layer 5c does not contain the n-type dopant element, unlike diffusion layer 3c, or contains a lower amount of the n-type dopant element than diffusion layer 3c.

The use of a silicon substrate as semiconductor substrate 1 gives an alloy layer of aluminum and silicon as aluminum-containing alloy layer 5b.

Etching both surfaces of semiconductor substrate 1 to remove the aluminum-containing alloy layers and sintered aluminum layers in step 3 gives semiconductor substrate 1 on each surface of which a diffusion layer (diffusion layer 3c and diffusion layer 5c) is formed as shown in FIG. 2(e).

Thus-formed diffusion layer 3c becomes an n+ layer because diffusion layer 3c is formed from the paste composition containing a specific amount of the n-type dopant element as described above. Diffusion layer 5c, on the other hand, does not contain the n-type dopant element, or contains a smaller amount of the n-type dopant element than diffusion layer 3c, thereby becoming a p layer.

Performing the steps described above to form diffusion layers as shown in FIGS. 2(a)-(e) enables simultaneous formation of diffusion layers on the both surfaces of a semiconductor substrate, making the process for forming the diffusion layers on 25 a substrate simple. A semiconductor substrate on each surface of which a diffusion layer is formed is useful for, for example, solar cells and semiconductor diode devices.

Etching in step 3 may be performed on only one surface of the substrate.

EXAMPLES

The following Examples more specifically describe the present invention, but the present invention is not limited to the embodiments of the Examples.

Example 1

40 parts by mass of an organic vehicle as a binder, 20 parts by mass of a mixture containing $P_2O_5$ and glass containing $P_2O_5$ ($P_2O_5$—SnO-based fritted glass) as an n-type dopant element-containing compound, and 100 parts by mass of a spherical aluminum powder were mixed, thereby preparing a paste composition containing phosphorus as an n-type dopant element. The organic vehicle was a mixture of 1 part by mass of ethyl cellulose (Dow) and 39 parts by mass of a glycol ether-based organic solvent.

The content of phosphorus was 1.52 parts by mass per 100 parts by mass of aluminum contained in the aluminum powder in the paste composition.

Separately, 40 parts by mass of the organic vehicle described above as a binder, 2 parts by mass of $B_2O_3$-based fritted glass containing no phosphorus, and 100 parts by mass of a spherical aluminum powder were mixed, thereby preparing an aluminum paste containing a non-n-type dopant element.

Subsequently, the paste composition was applied to one surface of a 200-µm-thick slice of p-type silicon substrate, and the substrate was dried at 100° C. to 300° C. The aluminum paste containing a non-n-type dopant element was applied to the other surface of the p-type silicon substrate, which is opposite the surface on which the paste composition was applied, followed by heating treatment including heating and cooling in a continuous furnace at a firing peak of 900° C. for 60 seconds. Further, the aluminum layers formed by sintering on both surfaces of the p-type silicon substrate were removed with hydrochloric acid, thereby giving a sample substrate.

Example 2

The procedure of Example 1 was repeated except that a paste composition was prepared using 28 parts by mass of the mixture containing $P_2O_5$ and glass containing $P_2O_5$ ($P_2O_5$—SnO-based fritted glass), thereby giving a sample substrate. The content of phosphorus was 2.21 parts by mass per 100 parts by mass of aluminum contained in the aluminum powder in the paste composition.

Example 3

The procedure of Example 1 was repeated except that a paste composition was prepared using polyoxyethylene oleyl ether phosphoric acid (i.e., an organic phosphorus compound), instead of the mixture containing $P_2O_5$ and glass containing $P_2O_5$ ($P_2O_5$—SnO-based fritted glass), in an amount of 20 parts by mass of the organic phosphorus compound per 100 parts by mass of the aluminum powder, thereby giving a sample substrate. The content of phosphorus was 1.58 parts by mass per 100 parts by mass of aluminum contained in the aluminum powder in the paste composition.

Example 4

The procedure of Example 1 was repeated except that a paste composition was prepared using polyoxyethylene oleyl ether phosphoric acid (i.e., an organic phosphorus compound), instead of the mixture containing $P_2O_5$ and glass containing $P_2O_5$ ($P_2O_5$—SnO-based fritted glass), in an amount of 40 parts by mass of the organic phosphorus compound per 100 parts by mass of the aluminum powder, thereby giving a sample substrate. The content of phosphorus was 3.16 parts by mass per 100 parts by mass of aluminum contained in the aluminum powder in the paste composition.

Example 5

The procedure of Example 1 was repeated except that a mixture of an inorganic phosphorus compound and an organic phosphorus compound was used instead of the mixture containing $P_2O_5$ and glass containing $P_2O_5$ ($P_2O_5$—SnO-based fritted glass), thereby giving a sample substrate. The inorganic phosphorus compound was a mixture of P, $P_2O_5$, and aluminum phosphate, and the organic phosphorus compound was polyoxyethylene oleyl ether phosphoric acid. The content of phosphorus was 2.77 parts by mass per 100 parts by mass of aluminum contained in the aluminum powder in the paste composition.

Comparative Example 1

40 parts by mass of the organic vehicle as a binder, 2 parts by mass of glass containing no phosphorus ($B_2O_3$-based fritted glass), and 100 parts by mass of a spherical aluminum powder were mixed, thereby preparing an aluminum paste containing no phosphorus.

Subsequently, the aluminum paste containing no phosphorus was applied to each surface of a 200-µm-thick slice of p-type silicon substrate, and the substrate was subjected to heating treatment including heating and cooling in a continuous furnace at a firing peak of 900° C. for 60 seconds. Further, the aluminum layers formed by sintering on both surfaces of the p-type silicon substrate were removed with hydrochloric acid, thereby giving a sample substrate.

Comparative Example 2

The procedure of Example 1 was repeated except that a paste composition was prepared using 7 parts by mass of the mixture of $P_2O_5$ and glass containing $P_2O_5$ ($P_2O_5$—SnO-based fritted glass), thereby giving a sample substrate. The content of phosphorus was 0.55 parts by mass per 100 parts by mass of aluminum contained in the aluminum powder in the paste composition.

Comparative Example 3

The procedure of Example 1 was repeated except that a paste composition was prepared using polyoxyethylene oleyl ether phosphoric acid (i.e., an organic phosphorus compound), instead of the mixture of $P_2O_5$ and glass containing $P_2O_5$ ($P_2O_5$—SnO-based fritted glass), in an amount of 6 parts by mass of the organic phosphorus compound per 100 parts by mass of the aluminum powder, thereby giving a sample substrate. The content of phosphorus was 0.32 parts by mass per 100 parts by mass of aluminum contained in the aluminum powder in the paste composition.

Confirmation of Diffusion Layer

The sample substrates obtained in the Examples and Comparative Examples were examined with a Suns Voc measurement instrument (Sinton Instruments, model: Suns-Voc) to determine whether an n layer had been formed. Specifically, the sample substrates were irradiated with flash light (light that attenuates over time) to excite electrons in the semiconductors, and the light intensity of the attenuating flash light and the change in voltage caused by electron excitation were continually measured to confirm the formation of an n layer. Table 1 shows the results.

TABLE 1

| Examples/Comparative Examples | Content of P per Al (parts by mass) | n Layer Formation (measured with Suns Voc) |
|---|---|---|
| Comparative Example 1 | 0 | not formed |
| Comparative Example 2 | 0.55 | not formed |
| Example 1 | 1.52 | formed |
| Example 2 | 2.21 | formed |
| Comparative Example 3 | 0.32 | not formed |
| Example 3 | 1.58 | formed |
| Example 4 | 3.16 | formed |
| Example 5 | 2.77 | formed |

Table 1 indicates that the sample substrate of Examples 2 to 5 all had an n layer formed on them. More specifically, the results reveal that a paste composition wherein the content of the n-type dopant element in the n-type dopant element-containing compound is 1.5 parts by mass or more and 1000 parts by mass or less, per 100 parts by mass of aluminum contained in the aluminum powder, can form an n layer on a semiconductor substrate. The results also indicate that an n-type layer can be formed regardless of the type of phosphorus compound.

Comparative Examples 1 to 3, in which the content of the n-type dopant element fell outside the numerical range, did not exhibit the formation of an n layer.

Figure 3:
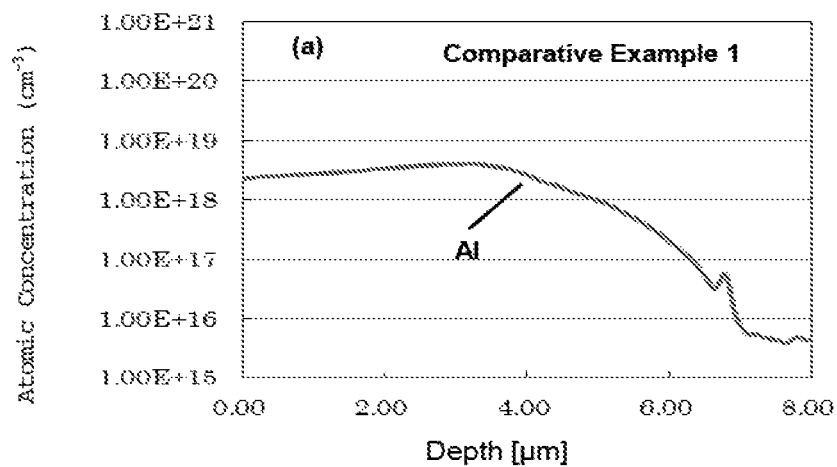
FIGS. 3(a)-3(c) are graphs presenting the results of element distribution analysis on the surface layer of the sample substrates obtained in Comparative Example 1, Example 2, and Example 5 using secondary ion mass spectrometry (SIMS).
Figure 3:
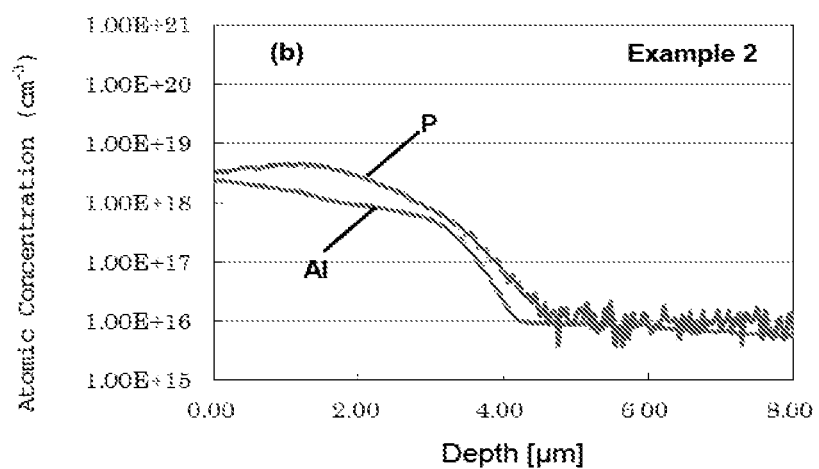
Figure 3:
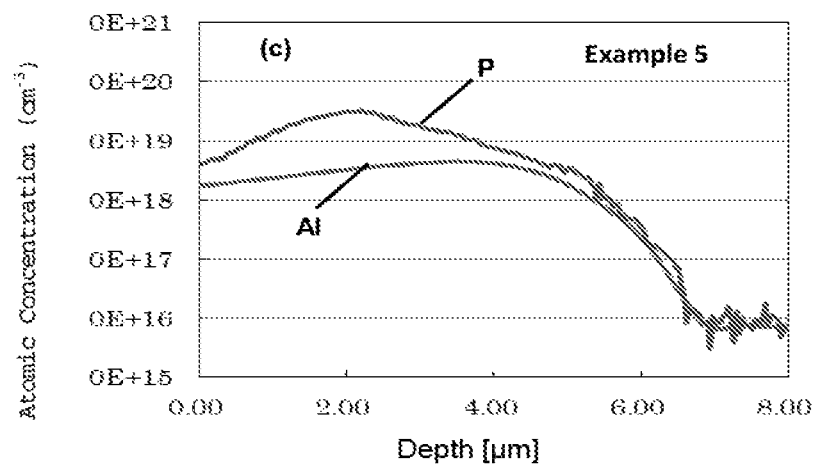

FIGS. 3(a) to 3(c) respectively show the results of element distribution analysis of the surface layers of the sample substrates obtained in Comparative Example 1, Example 2, and Example 5 by SIMS (secondary ion mass spectrometry).

The results of measurement with SIMS in FIGS. 3(a)-(c) show a correlation between the depth and the atomic concentration. The depth as used here is indicated by taking the surface of the semiconductor substrate on which the paste composition or 20 aluminum paste was applied as zero. The atomic concentration indicates the concentration of the dopant element doped into the semiconductor substrate, specifically the atomic concentration of aluminum and the atomic concentration of phosphorus. An n layer is formed when the atomic concentration of phosphorus, 25 which is an n-type dopant, is higher than that of aluminum, which is a p-type dopant.

As shown in FIG. 3(a), phosphorus, which is an n-type dopant element, was not detected, and only aluminum was detected in the sample substrate of Comparative Example 1.

FIGS. 3(b) and 3(c), however, show that the concentration of phosphorus, which is an n-type dopant, was higher than that of aluminum, which is a p-type dopant, and that the formed n-type layer had a depth of 3.0 to 6.0 μm.

The same effect as in the Examples is expected to be brought about by using arsenic, antimony, or bismuth, which are group 5 elements and are also dopants that form an n-type layer on a semiconductor substrate of silicon, germanium etc., as with phosphorus.

DESCRIPTION OF THE REFERENCE NUMERALS

1: semiconductor substrate
2: film
3a: sintered aluminum layer
3b: aluminum-containing alloy layer
3c: diffusion layer

The invention claimed is:

1. A paste composition for forming a film on a semiconductor substrate, the composition comprising
an aluminum powder,
a compound containing an n-type dopant element,
a resin, and
a solvent
wherein the n-type dopant element is one or both elements selected from the group consisting of phosphorus and arsenic, and
a content of the n-type dopant element in the n-type dopant element-containing compound is 1.5 parts by mass or more and 1000 parts by mass or less, per 100 parts by mass of aluminum contained in the aluminum powder.

* * * * *

UNITED STATES PATENT AND TRADEMARK OFFICE
CERTIFICATE OF CORRECTION

PATENT NO. : 10,446,291 B2
APPLICATION NO. : 15/747527
DATED : October 15, 2019
INVENTOR(S) : Marwan Dhamrin et al.

Page 1 of 1

It is certified that error appears in the above-identified patent and that said Letters Patent is hereby corrected as shown below:

On the Title Page

Item (72), change:
(72) Inventors: Marwin Dhamrin, Osaka (JP); Shota Suzuki, Osaka (JP); Ken Kikuchi, Osaka (JP); Masahiro Nakahara, Osaka (JP); Naoya Morishita, Osaka (JP)

To Read:
(72) Inventors: Marwan Dhamrin, Osaka (JP); Shota Suzuki, Osaka (JP); Ken Kikuchi, Osaka (JP); Masahiro Nakahara, Osaka (JP); Naoya Morishita, Osaka (JP)

Signed and Sealed this
Thirty-first Day of December, 2019

Andrei Iancu
*Director of the United States Patent and Trademark Office*